United States Patent
Kim et al.

(10) Patent No.: US 8,415,699 B2
(45) Date of Patent: Apr. 9, 2013

(54) LIGHT EMITTING DEVICE, LIGHT EMITTING DEVICE PACKAGE, AND ILLUMINATION SYSTEM

(75) Inventors: Sung Kyoon Kim, Seoul (KR); Hee Young Beom, Seoul (KR); Woo Sik Lim, Seoul (KR); Min Gyu Na, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 108 days.

(21) Appl. No.: 13/004,676

(22) Filed: Jan. 11, 2011

(65) Prior Publication Data

US 2011/0254035 A1 Oct. 20, 2011

(30) Foreign Application Priority Data

Apr. 15, 2010 (KR) .................. 10-2010-0034758

(51) Int. Cl.
*H01L 33/00* (2010.01)
(52) U.S. Cl. ................. 257/98; 257/99; 257/E33.066; 438/26
(58) Field of Classification Search ............ 257/98, 257/99, E33.001, E33.056, E33.057, E33.066; 438/26–28
See application file for complete search history.

(56) References Cited

U.S. PATENT DOCUMENTS

| 6,462,358 | B1 | 10/2002 | Lin et al. | |
|---|---|---|---|---|
| 7,276,742 | B2 | 10/2007 | Kohno et al. | |
| 2005/0012109 | A1* | 1/2005 | Kohno et al. | 257/103 |
| 2008/0224160 | A1 | 9/2008 | Chang et al. | |
| 2009/0267098 | A1* | 10/2009 | Choi | 257/98 |
| 2009/0315056 | A1 | 12/2009 | Kim | |

FOREIGN PATENT DOCUMENTS

| JP | 08-083929 | 3/1996 |
|---|---|---|
| JP | 2008-083929 A | 4/2008 |
| JP | 2008-255926 A | 10/2008 |
| KR | 10-2005-0044518 | 5/2005 |
| KR | 10-0632006 | 9/2006 |
| KR | 10-0890741 | 3/2009 |
| KR | 10-2009-0112307 | 10/2009 |

* cited by examiner

*Primary Examiner* — Julio J Maldonado
*Assistant Examiner* — Daniel Shook
(74) *Attorney, Agent, or Firm* — McKenna Long & Aldridge LLP

(57) ABSTRACT

Disclosed are a light emitting device, a light emitting device package, and an illumination system. The light emitting device includes a substrate; a light emitting structure layer including a first conductive type semiconductor layer formed on the substrate and having first and second upper surfaces, in which the second upper surface is closer to the substrate than the first upper surface, an active layer on the first conductive type semiconductor layer, and a second conductive type semiconductor layer on the active layer; a second electrode on the second conductive type semiconductor layer; and at least one first electrode extending at least from the second upper surface of the first conductive type semiconductor layer to a lower surface of the substrate by passing through the substrate.

20 Claims, 13 Drawing Sheets

LIGHT EMITTING DEVICE, LIGHT EMITTING DEVICE PACKAGE, AND ILLUMINATION SYSTEM

The present application claims priority under 35 U.S.C. §119(a) of Korean Patent Application No. 10-2010-0034758 filed on Apr. 15, 2010, which is hereby incorporated by reference in its entirety.

BACKGROUND

The embodiment provides a light emitting device, a light emitting device package, and an illumination system.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device having a novel electrode structure.

The embodiment provides a light emitting device having a growth substrate and a vertical type electrode structure.

According to the embodiment, a light emitting device includes a substrate; a light emitting structure layer including a first conductive type semiconductor layer formed on the substrate and having first and second upper surfaces, in which the second upper surface is closer to the substrate than the first upper surface, an active layer on the first conductive type semiconductor layer, and a second conductive type semiconductor layer on the active layer; a second electrode on the second conductive type semiconductor layer; and at least one first electrode extending at least from the second upper surface of the first conductive type semiconductor layer to a lower surface of the substrate by passing through the substrate.

According to the embodiment, a light emitting device includes a substrate including a transmittive material; a light emitting structure layer including a first conductive type semiconductor layer formed on the substrate and having an outer portion stepped from at least one side of the substrate, an active layer on an inner portion of the first conductive type semiconductor layer, and a second conductive type semiconductor layer on the active layer; a second electrode on the second conductive type semiconductor layer; and a plurality of first electrodes extending from a lower surface of the substrate to a side surface of the outer portion of the first conductive type semiconductor layer by passing through the substrate.

DETAILED DESCRIPTION OF THE EMBODIMENTS

Figure 1:
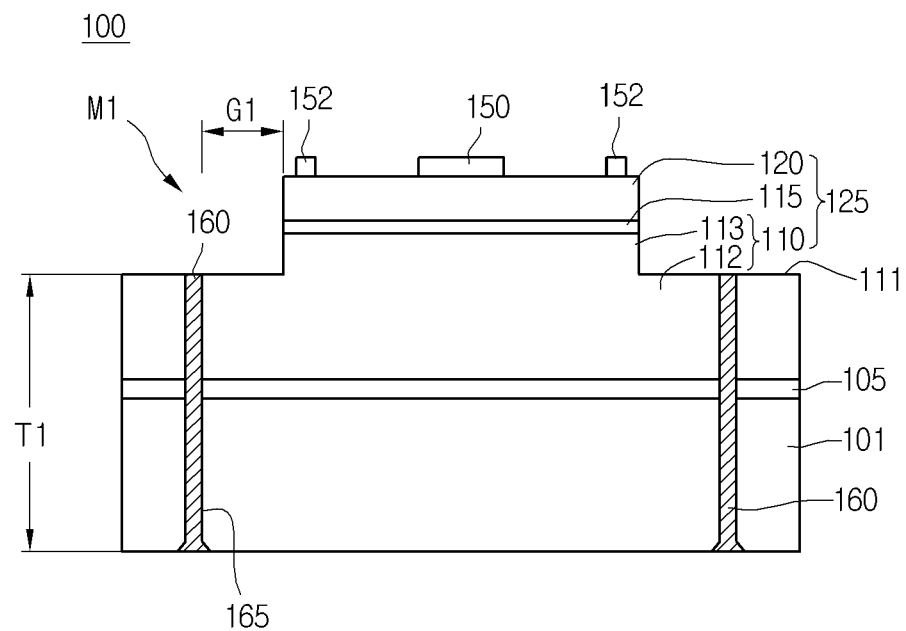
FIG. 1 is a side sectional view showing a light emitting device according to a first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
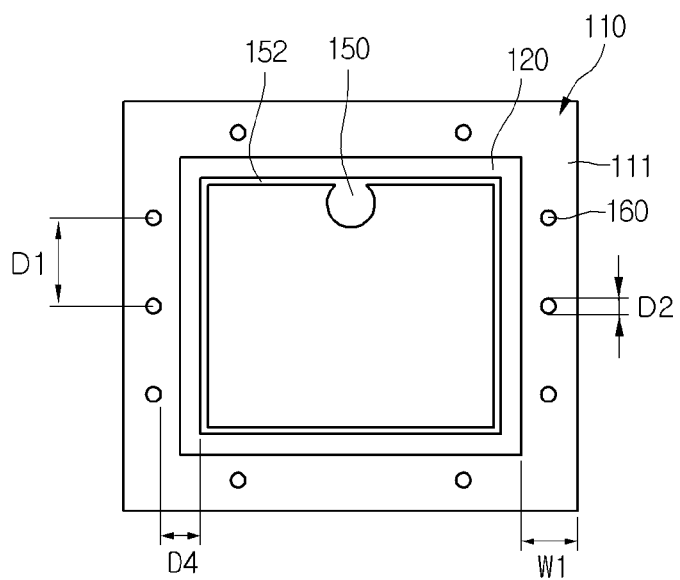
FIG. 2 is a plan view of FIG. 1.

FIG. 1 is a sectional view showing a light emitting device 100 according to a first embodiment, and FIG. 2 is a plan view of FIG. 1.

Referring to FIG. 1, the light emitting device 100 includes a substrate 101, a first semiconductor layer 105, a first conductive type semiconductor layer 110, an active layer 115, a second conductive type semiconductor layer 120, second electrodes 150 and 152, and a first electrode 160.

The light emitting device 100 includes an LED including a plurality of compound semiconductor layers, for example, compound semiconductors of group III-V elements. The LED may emit blue, green, or red light in a visible ray band or light in a UV band.

The substrate 101 is a growth substrate including an insulating material or a conductive material using a compound semiconductor to be grown. The substrate 101 may be selected from the group consisting of $Al_2O_3$, GaN, SiC, ZnO, Si, GaP, InP, $Ga_2O_3$, and GaAs. Hereinafter, an insulating growth substrate including sapphire ($Al_2O_3$) will be described as an example of the substrate 101, and the substrate 101 may include a transmissive substrate. The substrate 101 is provided thereon with a light extracting structure such as a concavo-convex structure or a roughness structure. The thickness of the substrate 101 may be in the range of 50 μm to 500 μm. If the substrate 101 includes a transmissive material, the emission angle of light can be improved.

The substrate 101 may be provided thereon with the first semiconductor layer 105. The first semiconductor layer 105 may have a pattern or layer based on compound semiconductors of group II to VI elements. The first semiconductor layer 105 may include one selected from the group consisting of ZnO, GaN, AlN, AlGaN, InGaN, InN, InAlGaN, AlInN, AlGaAs, GaP, GaAs, GaAsP, and AlGaInP. The first semiconductor layer 105 may include a buffer layer or an undoped semiconductor layer, and the buffer layer reduces a lattice constant difference between a nitride semiconductor and the substrate 101. The undoped semiconductor layer may include an undoped nitride semiconductor. In other words, the undoped semiconductor layer is a semiconductor layer which is not doped with conductive dopants intentionally. The undoped semiconductor layer has electrical conductivity remarkably lower than that of the first conductive type semiconductor layer 110. For example, the undoped semiconductor layer may include an undoped GaN layer and may have the characteristic of a first conductive type.

The first semiconductor layer 105 may include a superlative structure, and may include a material selected from the group consisting of GaN, InN, AlN, InGaN, AlGaN, InAlGaN, $SiO_2$, $SiO_x$, $SiN_2$, $SiN_x$, $SiO_xN_y$, and metallic material. The supperlattice structure includes at least two pairs in which at least two layers having different energy band gaps are alternately repeated. For example, the superlattice structure includes a stack structure of InGaN/GaN. Each layer of the superlattice structure may have a thickness of at least a few Å.

In addition, the first semiconductor layer 105 may include a reflective layer having a structure in which at least two layers having different refractive indexes are alternately stacked. For example, the first semiconductor layer 105 may include a DBR (Distributed Bragg Reflectors) having at least two stack structures of GaN/AlN layers.

The first conductive type semiconductor layer 110 is formed on the first semiconductor layer 105, and the active layer 115 is formed on the first conductive type semiconductor layer 110. The second conductive type semiconductor layer 120 is formed on the active layer 115. Another semiconductor layer may be further arranged on or under each layer, but the embodiment is not limited thereto.

The first conductive type semiconductor layer 110 may include a compound semiconductor of group III-V elements doped with first conductive type dopants. For example, the first conductive type semiconductor layer 110 may include a material selected from the group consisting of GaN, AlN, AlGaN, InGaN, InN, InAlGaN, AlInN, AlGaAs, GaP, GaAs, GaAsP, and AlGaInP. The first conductive type semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 110 may include an N type semiconductor layer. For example, the N type semiconductor layer includes N type dopants such as Si, Ge, Sn, Se, and Te. The first conductive type semiconductor layer 110 may serve as an electrode contact layer, and may have a single layer structure or a multiple layer structure, but the embodiment is not limited thereto.

The first conductive type semiconductor layer 110 may include a superlattice structure in which different semiconductor layers are stacked. The superlattice structure includes a GaN/InGaN structure or a GaN/AlGaN structure. The superlattice structure is obtained by stacking at least two pairs of two different layers having a thickness of at least a few Å.

The first conductive type semiconductor layer 110 includes at least two-step structure. For example, the first conductive type semiconductor layer 110 may include a structure having a width wider than a width of a lower surface of the first conductive type semiconductor layer 110.

The first conductive type semiconductor layer 110 includes a first part 112 and a second part 113. The first and second parts 112 and 113 may have the same semiconductor layer or different semiconductor layers. The first part 112 may be a lower portion of the first conductive type semiconductor layer 110, and the second part 113 may be an upper portion of the first conductive type semiconductor layer 110. The first and second parts 112 and 113 are distinguished from each other by a step structure. The first part 112 may further include a region having a step structure from at least one side surface or all side surfaces of the second part 113. Accordingly, the second part 113 may be provided in a predetermined region of the first part 112.

An upper surface of the second part 113 may have a width narrower than that of a lower surface of the first part 112 and equal to or wider than a width of a lower surface of the active layer 115. An outer upper surface 111 of the first part 112 is closer to the substrate 101 than an upper surface of the second part 113 is, and disposed outward from a side surface of the second part 113 or a side surface of the active layer 115. The outer upper surface 111 of the first part 112 of the first conductive type semiconductor layer 110 is disposed more outward than a side surface of the second conductive type semiconductor layer 120 when viewed in a plan view.

As shown in FIG. 2, the outer upper surface 111 of the first part 112 of the first conductive type semiconductor layer 110 may have a width W1 of about 1 μm to about 50 μm from the side surface of the second part 113. The width W1 may be distance between the side surface of the second part 113 and the side surface of the first part 112. As shown in FIG. 2, the side surface of the active layer 115 is spaced apart from the first electrode 160 at a predetermined distance G1, and the distance G1 prevents the short between the semiconductor layers 113, 115, and 120.

The outer upper surface 111 of the first part 112 of the first conductive type semiconductor layer 110 serves as a Ga-face, and may include a light extracting structure, for example, a rough structure.

The upper surface of the second part 113 of the first conductive type semiconductor layer 110 may be a top surface, and may be closer to the active layer 115 than the outer upper surface 111 of the first part 112 is. In addition, the outer upper surface 111 of the first part 112 may be closer to the substrate 111 than the top surface of the second part 113.

The active layer 115 is formed on the first conductive type semiconductor layer 110, and may have at least one selected from the group consisting of a single quantum well structure, a multiple quantum well structure, a quantum wire structure, and a quantum dot structure. The active layer 115 may have a stack structure including a well layer and a barrier layer, which are made from group III-V compound semiconductor material. For instance, the well layer of the active layer 115 has a compositional formula of $In_xAl_yGa_{1-x-y}N$ ($0 \leq x \leq 1$, $0 \leq y \leq 1$, and $0 \leq x+y \leq 1$) and the barrier layer of the active layer 115 has a compositional formula of $In_xAl_yGa_{1-x-y}N$ ($0 \leq x \leq 1$, $0 \leq y \leq 1$, and $0 \leq x+y \leq 1$). The active layer 115 may have a stack structure of at least one selected from the group consisting of InGaN well/GaN barrier layers, InGaN well/AlGaN barrier layers, and an InGaN well/InGaN barrier layers.

A first conductive clad layer may be disposed between the first conductive type semiconductor layer 110 and the active layer 115. The first conductive clad layer may include a GaN-based semiconductor. The first conductive clad layer has a bandgap greater than the bandgap of a barrier layer of the active layer 115, and confines carriers.

A second conductive clad layer may be disposed between the active layer 115 and the second conductive type semiconductor layer 120. The second conductive clad layer may include a GaN-based semiconductor. The second conductive clad layer has a bandgap greater than the bandgap of a barrier layer of the active layer 115, and confines carriers. The width of the active layer 115 may be narrower than that of the substrate 101.

The second conductive type semiconductor layer 120 is disposed on the active layer 115. The second conductive type semiconductor layer 120 may include compound semiconductors of group III-V elements doped with the second conductive dopants. For instance, the second conductive layer 120 may be selected from the group consisting of GaN, AlN, AlGaN, InGaN, InN, InAlGaN, AlInN, AlGaAs, GaP, GaAs, GaAsP, and AlGaInP. Preferably, the second conductive type semiconductor layer 120 may include a semiconductor material having a compositional formula of $In_xAl_yGa_{1-x-y}N$ ($0 \leq x \leq 1$, $0 \leq y \leq 1$, $0 \leq x+y \leq 1$).

The second conductive type semiconductor layer 120 has a single layer structure or a multiple layer structure. If the second conductive type semiconductor layer 120 has the multiple layer structure, the second conductive type semiconductor layer 120 may include a superlattice structure such as an AlGaN/GaN structure.

The second conductive type semiconductor layer 120 may include a P type semiconductor layer. For example, the P type semiconductor layer includes P type dopants such as Mg, Be, and Zn. The second conductive type semiconductor layer 120 may serve as an electrode contact layer, but the embodiment is not limited thereto.

The first conductive type semiconductor layer 110, the active layer 115, and the second conductive type semiconductor layer 120 may be defined as a light emitting structure layer 125. The first conductive type semiconductor layer 110 may include a P type semiconductor, and the second conductive type semiconductor layer 120 may include an N type semiconductor layer. The light emitting structure layer 125 may include a third conductive type semiconductor layer on the second conductive type semiconductor layer 120, and the third conductive type semiconductor layer may include a semiconductor layer having a polarity opposite to that of the second conductive type. The light emitting structure layer 125 may include at least one of an N-P junction structure, a P-N junction structure, an N-P-N junction structure, and a P-N-P junction structure. In this case, "N" represents an N type semiconductor layer, "P" represents a P type semiconductor, and "-" represents a structure in which semiconductor layers are directly or indirectly stacked on each other. Hereinafter, a structure in which the second conductive type semiconductor layer 120 is provided at the upper most layer of the light emitting structure layer 125 will be described as one example.

The second electrode 152 is provided on the second conductive type semiconductor layer 120, and includes the pad 150 electrically connected to second electrode 152. The second electrode 152 may have a single layer structure or a multiple layer structure including at least one selected from the group consisting of Ti, Al, Al alloy, In, Ta, Pd, Co, Ni, Si, Ge, Ag, Ag alloy, Au, Hf, Pt, Ru and Au, or the alloy thereof. At least one pad 150 may be formed, and the second electrode 152 is electrically connected to the pad 150. For example, the second electrode 152 may be connected to the pad 150 in at least one of a branch shape, an arm shape, and a finger shape.

The second electrode 152 may have a loop shape at an outer peripheral portion of a top surface of the second conductive type semiconductor layer 120. The loop shape is formed closely to an edge of the second conductive type semiconductor layer 120. The loop shape may be continuously or discontinuously formed. The second electrode 152 may be close to a plurality of first electrodes 160.

A current spreading layer or a transmissive layer may be disposed between the second electrode 152 and the second conductive type semiconductor layer 120. The current spreading layer includes a transmittive oxide material or a transmittive nitride material. For instance, the current spreading layer may include a material selected from the group consisting of ITO (indium tin oxide), IZO (indium zinc oxide), IZON (IZO nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). The current spreading layer is formed on the second conductive type semiconductor layer 120, and spreads current into the whole region.

The first electrode 160 may be arranged in a region that does not overlap with the active layer 115 while being a vertical direction to the active layer 115. Preferably, the first electrode 160 may be arranged in a channel region M, that is, a region of exposing the first conductive type semiconductor layer 110. The first electrode 160 may be arranged in at least one region that does not overlap with the second electrode 152 while being perpendicular to the second electrode 152. The region of exposing the first conductive type semiconductor layer 110 may be provided outside at least one side surface of the active layer 115.

The first electrode 160 may be spaced apart from at least one side surface of the active layer 115, preferably, may be spaced from two side surfaces or four side surfaces of the active layer 115. In addition, the first electrode 160 may be disposed closer to the side surface of the first part 112 of the first conductive type semiconductor layer 110. The first electrode 160 may be disposed closer to the edge of the first conductive type semiconductor layer 110 than the side surface of the active layer 115.

At least one hole 165 is formed in the substrate 101, the first semiconductor layer 105 and the first part 112 of the first conductive type semiconductor layer 110. The hole 165 includes a conductive material. The conductive material may include metal. The first electrode 160 may be formed through a plating process.

The first electrode 160 may include one selected from the group consisting of Cu, Ti, Cr, Ta, Al, In, Pd, Co, Ni, Ge, Ag, and Au or the alloy thereof. The first electrode 160 may include a conductive compound including metal. For instance, the first electrode 160 may include metal oxide, but the embodiment is not limited thereto.

The first electrode 160 may extend from the first part 112 of the first conductive type semiconductor layer 110 to a lower portion of the substrate 101. One first electrode 160 or a plurality of first electrodes 160 may be provided. If one first electrode 160 is provided, current may not be smoothly supplied. Hereinafter, the embodiment employing a plurality of first electrodes 160 will be described.

An upper end of the first electrode 160 may be exposed to the top surface 111 of the first part 112, and a lower end of the first electrode 160 may be exposed to a lower surface of the substrate 101.

Each first electrode 160 may have the form of a via penetrating from the first part 112 of the first conductive type semiconductor layer 110 to the substrate 101. The via may have the form of a line perpendicular to the lower surface of the substrate 101 or a line that is not perpendicular to the lower surface of the substrate 101.

The first electrodes 160 may be spaced apart from each other at a predetermined distance. For instance, the first electrodes 160 may be arranged periodically, randomly, or irregularly. The interval between the first electrodes 160 may vary according to the current efficiency and the pattern of the second electrode 150.

At least one of the first electrodes 160 may be provided inside the first part 112 of the first conductive type semiconductor layer 110 or may be exposed out of an external wall of a device.

The first electrodes 160 are exposed out of a lower portion of the substrate 101. The first electrodes 160 may be connected to each other by using a predetermined pattern or a predetermined layer at the lower portion of the substrate 101. The lower ends of the first electrodes 160 serve as pads, or pads may be additionally formed.

A thickness T1 between the lower surface of the substrate 101 and the first part 112 of the first conductive type semiconductor layer 110 is about 2 µm to about 3 µm thicker than a substrate thickness. A thickness of the substrate 101 may be in the range of about 100 µm to about 400 µm. The lower surface of the substrate 101 may have a flat structure or a rough structure, but the embodiment is not limited thereto.

Figure 3:
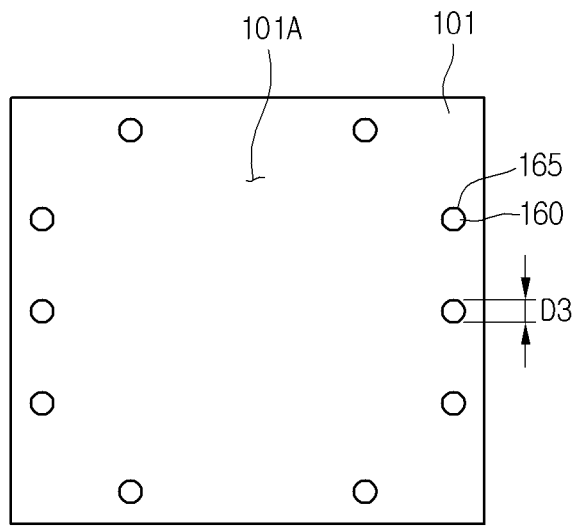
FIG. 3 is a bottom view of FIG. 1.

FIG. 2 is a plan view of FIG. 1, and FIG. 3 is a bottom view of FIG. 2.

Referring to FIGS. 2 and 3, in the second electrode 152, the width of the pad 150 may be wider than the line width of the second electrode 152. The line width of the second electrode 152 may be gradually reduced from the pad 150 to a predetermined section, but the embodiment is not limited thereto.

The pad 150 may be arranged between corners, or arranged at a part of the corner, but the embodiment is not limited thereto.

The pad 150 and the second electrode 152 connected to the pad 150 may be closer to the edge of the second conductive type semiconductor layer 120 than to the center of the second conductive type semiconductor layer 120, and may be arranged within a predetermined distance D4 from a virtual line linking the first electrodes 160 to each other.

The second electrode 152 and the pad 150 are arranged at an edge of the top surface of the second conductive type semiconductor layer 120 rather than at the center of the top surface of the second conductive type semiconductor layer 120, so that the light loss caused by the pad 150 and a wire bonded to the pad 150 can be prevented.

A transmissive conductive layer is further arranged between the second conductive type semiconductor layer 120 and the second electrode 152, so that current can be spread into the whole region. Accordingly, internal quantum efficiency can be improved.

The upper ends of a plurality of the first electrodes 160 are provided on the upper surface 111 of the first conductive type semiconductor layer 110 spaced apart from at least one side surface, for example, four side surfaces of the active layer 115, and the second electrode 152 may have a loop shape corresponding to a plurality of the first electrodes 160.

The pad 150 may be arranged at the center of a chip when viewed at the top of the chip. The arrangement of the pad 150 may be changed within the technical scope of the embodiment.

The second electrode 152 may branch from the pad 150 with a branch shape. For example, the second electrode 152 may have a continuous loop shape or a discontinuous loop shape. The second electrode 152 may have various shapes such as a radial pattern, at least one branch pattern, a curved pattern, a straight line pattern, a polygonal pattern, a circular pattern, or the combination thereof, but the embodiment is not limited thereto.

The first electrodes 160 are spaced apart from each other at a distance D1 or more on the upper surface of the first part 112 of the first conductive type semiconductor layer 110, and arranged corresponding to the second electrode 152. The upper ends of the first electrodes 160 are provided within a predetermined distance from the second electrode 152 of the second electrode 152 as shown in FIG. 2. The lower ends of the first electrodes 160 may be arranged along the periphery of a lower surface 101A of the substrate 101 as shown in FIG. 3.

Since the first electrodes 160 are arranged corresponding to the second electrode 152 of the second electrode 152, current can uniformly flow throughout the whole region of the light emitting structure layer 125.

An upper diameter D2 (shown in FIG. 2) of the first electrode 160 may be smaller than a lower diameter (shown in FIG. 3) or a width D3 of the first electrode 160. The upper diameter or the width D2 may be in the range of about 1 µm to about 50 µm. Although the first electrode 160 has a circular outer shape as shown in drawings, the first electrode 160 may have various outer shapes such as a polygonal shape, an oval shape, or the combination of an angled shape and a spherical shape other than the circular shape.

As shown in FIG. 1, the transmissive substrate 101 is arranged in the light emitting device having a vertical type electrode structure, so that the emission angle of traveling light can be improved due to the thickness of the transmissive substrate 101. Accordingly, light extraction efficiency can be improved.

Figure 4A:
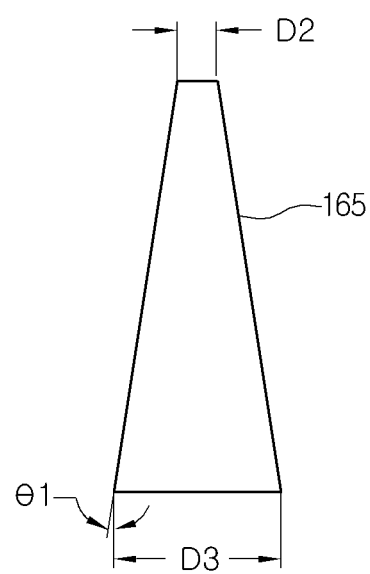
FIGS. 4A and 4B are views showing examples of a hole of FIG. 1.
Figure 4B:
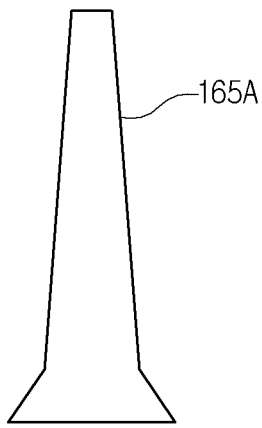

FIGS. 4A and 4B are views showing the hole 165 of FIG. 1.

As shown in FIG. 4A, the hole 165 may have a trapezoid shape. The lower diameter (or width) D3 of the hole 165 is in the range of about 0.5 µm to about 50 µm, and the upper diameter (or width) D2 of the hole 165 is in the range of about 0.5 µm to about 20 µm. In this case, the hole 165 may be formed under a condition of D3>D2. The upper and lower diameters D2 and D3 may vary according to the size of the device. An inclination angle θ1 of the hole 165 may satisfy a condition of 0<θ1<30° with respect to a virtual axis perpendicular to the lower surface of the substrate 101. Since the shape of the hole 165 may be approximately identical to the shape of the first electrode 160, the shape of the first electrode 160 is based on the shape of the hole 165.

As shown in FIG. 4B, a hole 165A has an inclination structure having various angles about a virtual axis perpendicular to the lower surface of the substrate 101, and the inclination structure is provided at a lower portion of the hole 165A. The inclination structure provided at the lower portion of the hole 165A may have a lower end which is has a width wider than a width of an upper end.

FIGS. 5 to 10 are sectional views showing the manufacturing process of the light emitting device of FIG. 1.

Figure 5:
FIGS. 5 to 10 are views showing the manufacturing process of the light emitting device of FIG. 1.

Referring to FIG. 5, the substrate 101 is loaded on growing equipment and a compound semiconductor layer of II to VI group elements may be formed on the substrate 101.

The growing equipment may include E-beam deposition equipment, PVD (physical vapor deposition) equipment, CVD (chemical vapor deposition) equipment, PLD (plasma laser deposition) equipment, a dual-type thermal evaporator, sputtering equipment and MOCVD (metal organic chemical vapor deposition) equipment. However, the embodiment is not limited thereto.

The substrate 101 may include a conductive substrate or an insulating substrate. For instance, the substrate 101 may include a material selected from the group consisting of sapphire ($Al_2O_3$), GaN, SiC, ZnO, Si, GaP, InP, $Ga_2O_3$, and GaAs. The substrate 101 may be provided on a top surface thereof with a concavo-convex structure including a lens shape or a stripe shape, and the concavo-convex structure may include a pattern or a roughness. In addition, the substrate 101 may be provided thereon with the first conductive layer 105, and the first conductive layer 105 may include a layer or a pattern using compound semiconductors of group II to VI elements. For example, at least one of a ZnO layer (not shown), a buffer layer (not shown) and an undoped semiconductor layer (not shown) may be formed on the substrate 101. The buffer layer and the undoped semiconductor layer may include the compound semiconductors of the group III-V elements. The buffer layer reduces a lattice constant difference from the substrate 101. The undoped semiconductor layer has conductivity lower than that of the first conductive type semiconductor layer 110, and may include an undoped GaN-based semiconductor.

The first semiconductor layer 105 may include a material selected from the group consisting of GaN, InN, AlN, InGaN, AlGaN, InAlGaN, $SiO_2$, $SiO_x$, $SiN_2$, $SiN_x$, $SiO_xN_y$, and metal. The first semiconductor layer 105 may have a heterojunctioned superlattice structure or a light extraction structure. The first semiconductor layer 105 may have a DBR structure in which at least two layers having different refractive indexes are alternately grown. At least one of a buffer layer, an undoped semiconductor layer, a superlattice structure, and a DBR structure may be formed on the substrate 101.

Figure 6:
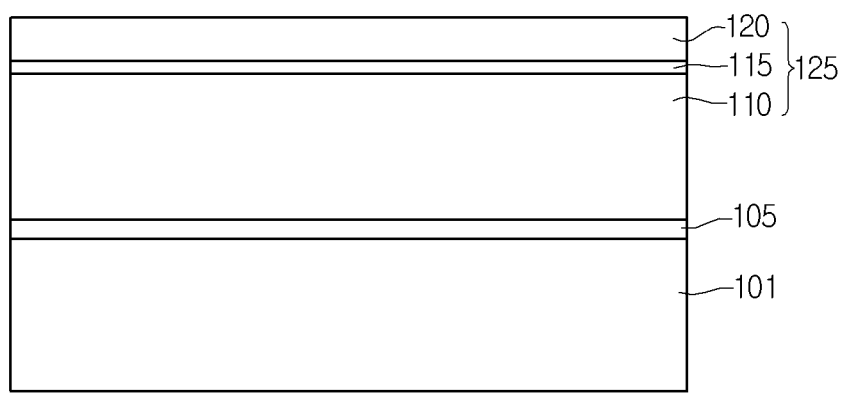

Referring to FIGS. 5 and 6, the light emitting structure layer 125 may be formed on the first semiconductor layer 105. The light emitting structure layer 125 includes the first conductive type semiconductor layer 110, the active layer 115, and the second conductive type semiconductor layer 120. Another layer may be provided on or under each layer, but the embodiment is not limited thereto.

The first conductive type semiconductor layer 110 is formed on the first semiconductor layer 105, and may include one selected from the group consisting of GaN, AlN, AlGaN, InGaN, InN, InAlGaN, AlInN, AlGaAs, GaP, GaAs, GaAsP, and AlGaInP, which are compound semiconductors of III-V group elements doped with the first conductive dopant. The first conductive type semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$). The first conductive type semiconductor layer 110 is the N type semiconductor layer, and the N type semiconductor layer includes an N type dopant such as Si, Ge, Sn, Se or Te. The first conductive type semiconductor layer 110 may serve as an electrode contact layer, and may have the single layer or the multilayer. However, the embodiment is not limited thereto.

The first conductive type semiconductor layer 110 may have a superlattice structure in which different semiconductor layers are alternately stacked, and the superlattice structure includes a GaN/InGaN structure or a GaN/AlGaN structure.

The active layer 115 is formed on the first conductive type semiconductor layer 110, and may have a single quantum well structure or a multiple quantum well structure. The active layer 115 may have a stack structure including a well layer and a barrier layer, which are made from group III-V compound semiconductor material. For instance, the active layer 115 may have a stack structure of at least one of InGaN well/GaN barrier layers, InGaN well/AlGaN barrier layers, and an InGaN well/InGaN barrier layers.

The first conductive clad layer may be interposed between the first conductive type semiconductor layer 110 and the active layer 115. The first conductive clad layer may include a GaN-based semiconductor. The first conductive clad layer has a bandgap greater than the bandgap of a barrier layer of the active layer 115, and confines carriers.

The second conductive clad layer may be interposed between the second conductive type semiconductor layer 120 and the active layer 115. The second conductive clad layer may include a GaN-based semiconductor. The second conductive clad layer has a bandgap greater than the bandgap of a barrier layer of the active layer 115, and confines carriers.

The second conductive type semiconductor layer 120 is provided on the active layer 115. The second conductive type semiconductor layer 120 may include compound semiconductors of group III-V elements doped with the second conductive dopants. For instance, the second conductive layer 120 may be selected from the group consisting of GaN, AlN, AlGaN, InGaN, InN, InAlGaN, AlInN, AlGaAs, GaP, GaAs, GaAsP, and AlGaInP. Preferably, the second conductive type semiconductor layer 120 may include a semiconductor material having a compositional formula of $In_xAl_yGa_{1-x-y}N$ ($0 \leq x \leq 1$, $0 \leq y \leq 1$, $0 \leq x+y \leq 1$).

The second conductive type semiconductor layer 120 has a single layer structure or a multiple layer structure. If the second conductive type semiconductor layer 120 has the multiple layer structure, the second conductive type semiconductor layer 120 may include a superlattice structure such as an AlGaN/GaN structure.

The second conductive type semiconductor layer 120 may include a P type semiconductor layer. For example, the P type semiconductor layer includes P type dopants such as Mg, Be, and Zn. The second conductive type semiconductor layer 120 may serve as an electrode contact layer, but the embodiment is not limited thereto.

The first conductive type semiconductor layer 110, the active layer 115, and the second conductive type semiconductor layer 120 may be defined as the light emitting structure layer 125. The light emitting structure layer 125 may further include a third conductive type semiconductor layer on the second conductive type semiconductor layer 120, and the third conductive type semiconductor layer may include a semiconductor layer having a polarity opposite to that of the second conductive type. The light emitting structure layer 125 may include at least one of an N-P junction structure, a P-N junction structure, an N-P-N junction structure, and a P-N-P junction structure. In this case, "N" represents an N type semiconductor layer, "P" represents a P type semiconductor, and "-" represents a structure in which semiconductor layers are directly or indirectly stacked on each other. Hereinafter, a structure in which the second conductive type semiconductor layer 120 is provided at the upper most layer of the light emitting structure layer 125 will be described as one example.

Figure 7:
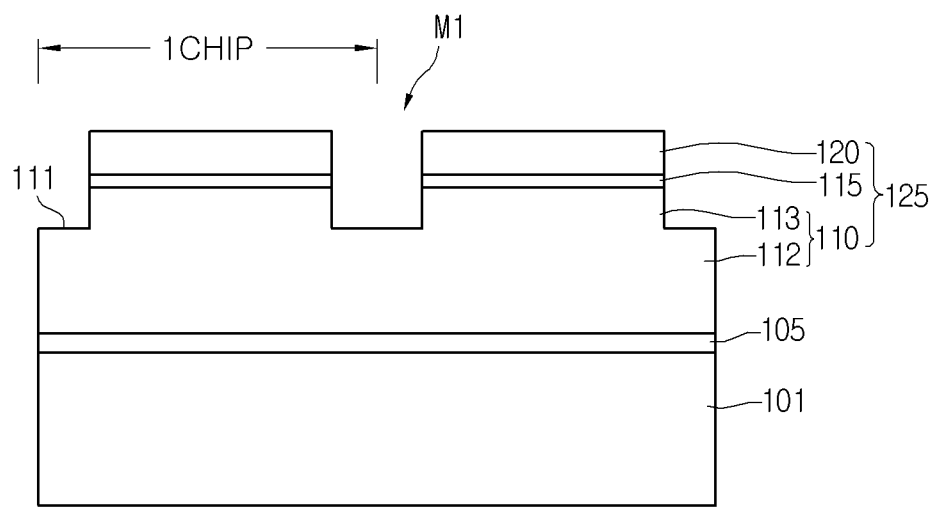

Referring to FIG. 7, an etching process is performed. For example, the etching process is performed at a predetermined depth from the second conductive type semiconductor layer 120. The etching process is performed with respect to an outer peripheral portion of a chip, that is, a channel region. The etching process may include an isolation etching process to divide chips and/or a mesa etching process to expose a part of the first conductive type semiconductor layer 110.

Through the etching process, a part of the first conductive type semiconductor layer 110, for example, the upper surface of the first part 112 is exposed. In the first conductive type semiconductor layer 110, the first part 112 and the second part 113 form a step structure. In other words, through the etching process, the boundary between chips, that is, a channel region M1 is exposed.

Figure 8:
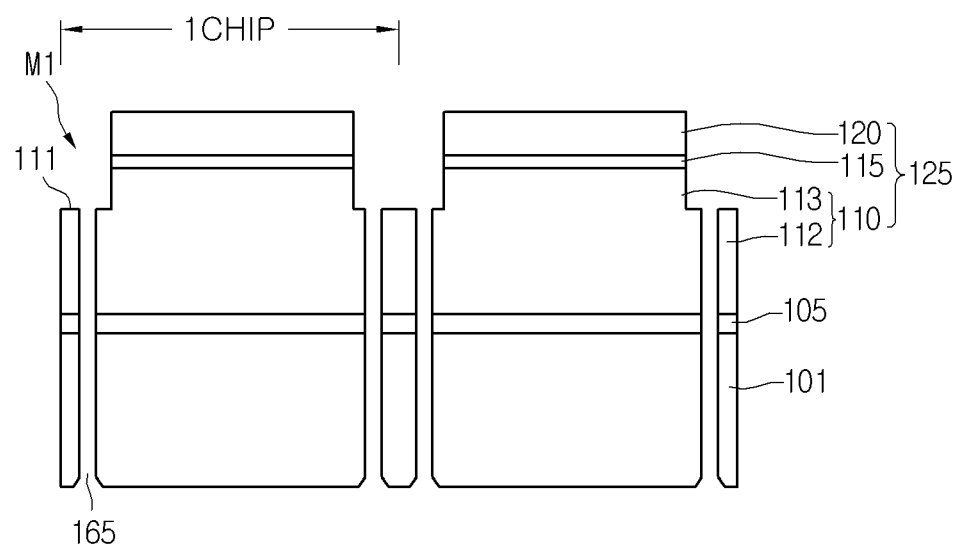

Referring to FIG. 8, a plurality of holes 165 are formed in the channel region M1. The holes 165 may extend from the first part 112 of the first conductive type semiconductor layer 110 to the lower surface of the substrate 101 by using a laser and/or a drill.

The holes 165 may be formed as shown FIGS. 2 and 3. The holes 165 may have a structure in which the diameter of the upper end is smaller than that of the lower end as shown in FIG. 4.

The holes 165 are formed along an outer peripheral portion of an individual chip. The interval between the holes 165 may be constant, irregular, or random. For example, the holes 165 may be formed along at least one of four sidewalls of each chip or may be formed on two opposite sidewalls or all sidewalls of the chip.

Figure 9:
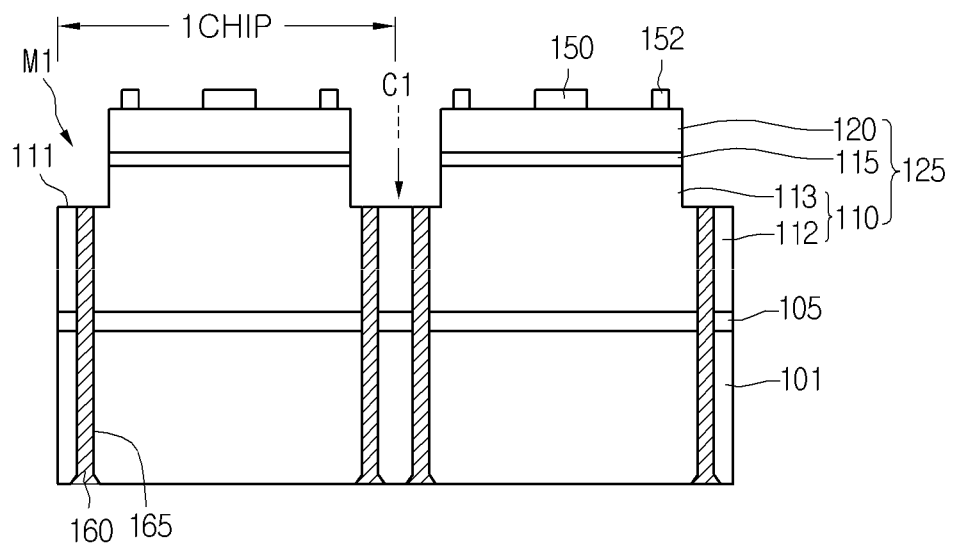

Referring to FIG. 9, the second electrode 152 is formed in the second conductive type semiconductor layer 120, and the first electrode 160 is formed in the hole 165 of the first conductive type semiconductor layer 110. For example, the first electrode 160 may be formed through a plating process after a seed layer has been formed, or may be formed through a filling process, but the embodiment is not limited thereto.

The first electrode 160 may include one of selected from the group consisting of Cu, Ti, Cr, Ta, Al, In, Pd, Co, Ni, Ge, Ag, and Au or the alloy thereof. The first electrode 160 may include a non-metallic conductive material, but the embodiment is not limited thereto.

The second electrode 152 includes the pad 150. The second electrode 152 may have a single layer structure or a multiple layer structure including at least one selected from the group consisting of Ti, Al, Al alloy, In, Ta, Pd, Co, Ni, Si, Ge, Ag, Ag alloy, Au, Hf, Pt, Ru, and Au, or the alloy thereof. Although the second electrode 152 may include at least one pad 150, if the second electrode 152 has a large area, two pads may be provided, but the embodiment is not limited thereto.

The second electrode 152 is connected to the pad 150, and may have at least one of a loop shape, a straight line shape, a curved shape, a polygonal shape, and a circular shape, but the embodiment is not limited thereto.

A current spreading layer may be formed between the second electrode 152 and the second conductive type semiconductor layer 120. The current spreading layer may be formed on the second conductive type semiconductor layer 120. The current spreading layer may be formed before or after an etching process has been performed, but the embodiment is not limited thereto. The current spreading layer may include a transmittive oxide or a transmittive nitride material. For example, the current blocking layer may include a material selected from the group consisting of ITO, IZO, IZTO, IAZO, IGZO, IGTO, AZO, ATO, and GZO. However, the current spreading layer may not be formed, but the embodiment is not limited thereto.

Figure 10:
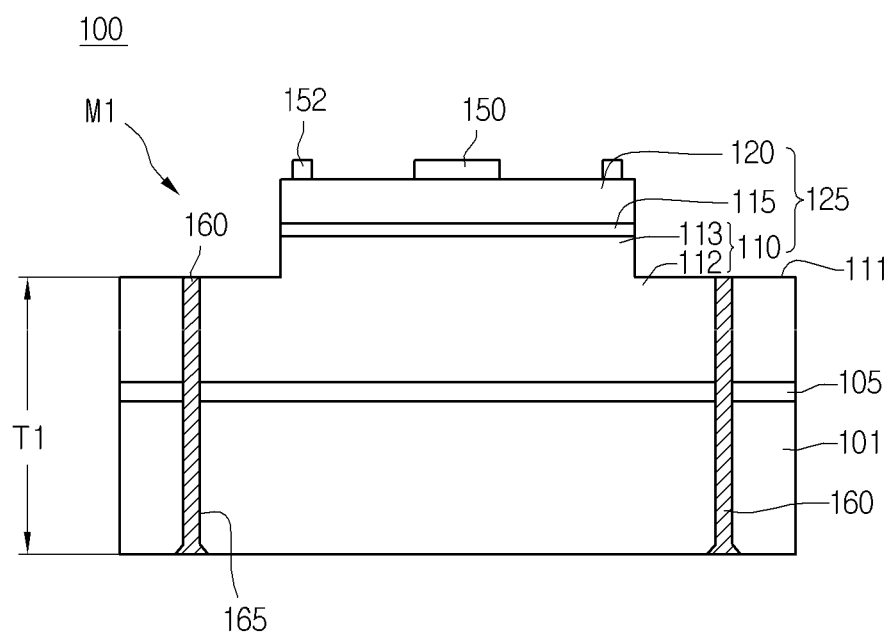

Thereafter, an individual chip shown in FIG. 10 is formed through a cutting process or a braking process along a boundary line C1 between chips.

Referring to FIG. 10, a plurality of the first electrodes 160 are provided on a lower surface of the substrate 101, and power having first polarity is supplied to the first conductive type semiconductor layer 110 through the first electrodes 160. The pad 150 of the second electrode 152 is connected to a connection member such as a wire and receives power having second polarity. In addition, the power having the second polarity is supplied to the second conductive type semiconductor layer 120 through the pad 150 and the second electrode 152. Accordingly, uniform power can be supplied to the entire portion of the light emitting device 100, so that the internal quantum efficiency can be improved.

Figure 11:
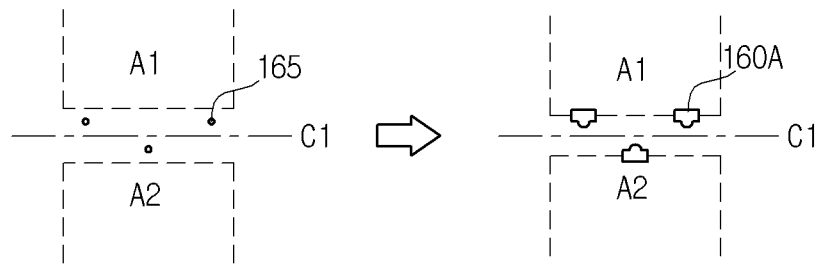
FIGS. 11 to 13 are views showing examples of forming a first electrode and holes in a channel region according to the embodiment.
Figure 12:
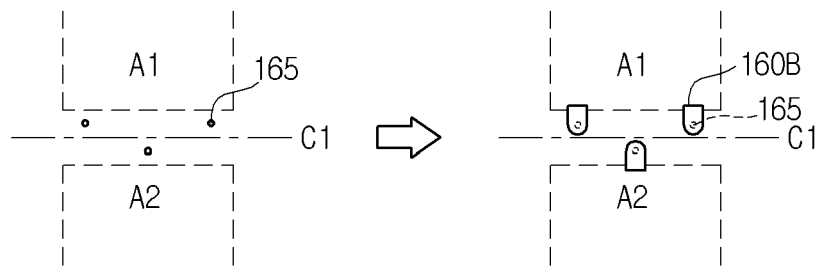
Figure 13:
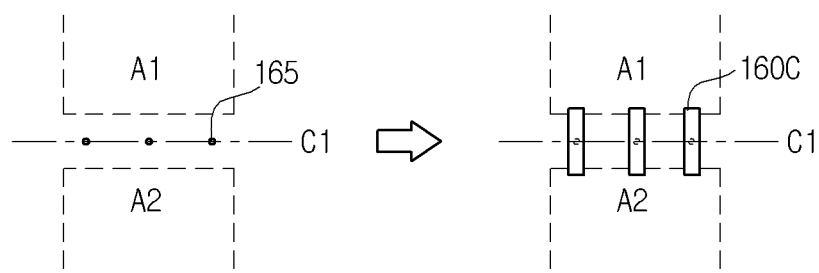

FIGS. 11 to 13 are views showing another example of a hole and the first electrode in a channel region of the light emitting device. The holes are abnormally formed in a light emitting area. Reference signs A1 and A2 represent a chip area, and reference sign C1 represents a boundary line dividing a first part of the first conductive type semiconductor layer in a chip area.

Referring to FIG. 11, the holes 165 may be arranged at both sides of the boundary line C1 in an isolation region of the two adjacent chip areas A1 and A2. The holes 165 may be arranged in each of the chip areas A1 and A2.

Electrodes 160A are formed in the holes 165, and extend at a conductive pattern on a surface of the isolation region, so that the electrodes 160A may be arranged in each of the chip areas A1 and A2. In this case, the conductive pattern may have a width defined from the boundary line C1 toward each of the chip areas A1 and A2.

In this case, the width of the two adjacent chip areas may be in the range of about 5 μm to about 100 μm, and may serve as a channel region between chips on the substrate.

Referring to FIG. 12, when the holes 165 may be arranged at both sides of the boundary line C1 in an isolation area of the two adjacent chip areas A1 and A2, the holes 165 may be assigned to each of the chip areas A1 and A2. Electrodes 160B extend at a conductive pattern in the inner part of the holes 165 and on the surface of the holes 165, so that the electrodes 160B may be arranged in each of the chip areas A1 and A2.

Referring to FIG. 13, when the holes 165 may be formed on the boundary line C1 in a channel region of the two adjacent chip areas A1 and A2, the holes 165 may share the isolation area of each of the chip areas A1 and A2. First electrodes 160C extend at a conductive pattern in the inner part of the holes 165 and on the surface of the holes 165, so that the first electrodes 160C may be electrically connected to the chip areas A1 and A2. In this case, the conductive pattern may extend from the boundary line C1 and may be electrically connected to a semiconductor layer (e.g., the first conductive type semiconductor layer 110) of each of the chip regions A1 and A2. In this case, an outer portion of the first electrode 160C may be exposed to the outside of the chip.

Figure 14:
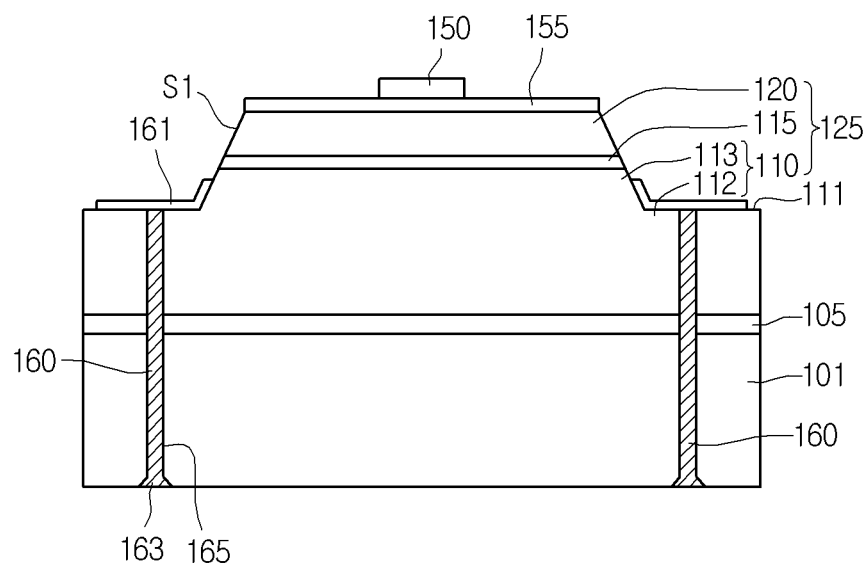
FIG. 14 is a side sectional view showing a light emitting device according to a second embodiment.

FIG. 14 is a side sectional view showing a light emitting device according to a second embodiment. In the following description about the second embodiment, structures and components the same as those of the first embodiment will be not further described in order to avoid redundancy.

Referring to FIG. 14, a light emitting device 100A includes the light emitting structure layer 125 (110, 115, and 120) having an inclined side surface S1. A first conductive layer 161 may be provided at an outer peripheral portion of the first conductive type semiconductor layer 110. The first conductive layer 161 may extend from the top surface 111 the first part 112 of the first conductive type semiconductor layer 110 to a side surface of the second part 113. The first conductive layer 161 may include a material the same as a material of the first electrode, another conductive metallic material, or a transmissive conductive material.

The first conductive layer 161 connects upper ends of at least two first electrodes 160 to each other, stably supplies power having first polarity, and diffuses current. The first conductive layer 161 has a predetermined width and may have a closed loop shape or an open loop shape. One first conductive layer 161 or a plurality of first conductive parts 161 may be provided, but the embodiment is not limited thereto.

Lower ends 163 of the first electrodes 160 may be individually arranged, or may be connected to each other in the unit of one group.

The second electrode 150 includes a pad, and a current spreading layer 155 may be disposed between the pad and the second conductive type semiconductor layer 120. The current spreading layer 155 may be formed on the substantially entire portion of the second conductive type semiconductor layer 120. The current spreading layer 155 may include a transmissive conductive oxide or a transmissive conductive nitride. The current spreading layer 155 may include a material selected from the group consisting of ITO, IZO, IZTO, IAZO, IGZO, IGTO, AZO, ATO, and GZO. The current spreading layer 155 may not be formed, but the embodiment is not limited thereto.

Figure 15:
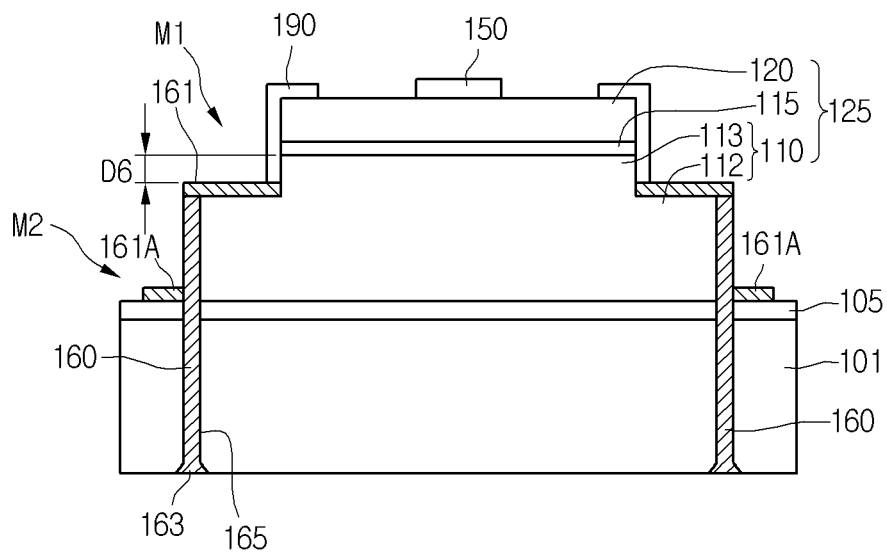
FIG. 15 is a side sectional view showing a light emitting device according to a third embodiment.

FIG. 15 is a side sectional view showing a light emitting device according to a third embodiment. In the following description about the third embodiment, structures and components the same as those of the first embodiment will be not further described in order to avoid redundancy.

Referring to FIG. 15, in a light emitting device 100B, the first electrode 160 passes through the first part 112 of the first conductive type semiconductor layer 110 and the substrate 101. In the light emitting device 100B, the top surface 111 of the first part 112 of the first conductive type semiconductor layer 110 and a top surface of the first semiconductor layer 105 may be exposed. Although an example of exposing the first semiconductor layer 105 has been described, a top surface of an outer portion of the substrate 101 may be exposed.

In a second channel region M2, the top surface of the first semiconductor layer 105 may be further exposed due to an isolation etching process to separate chips from each other. A first channel region M1 may be formed through a mesa etching process to expose a portion of the first conductive type semiconductor layer 110. The first and second channel regions M1 and M2 may have a step structure.

The first electrode 160 has a structure in which a first conductive layer 161 extends from the top surface 111 of the first conductive type semiconductor layer 110, and a second conductive layer 161A extends on a top surface of the first semiconductor layer 105. Since the first electrode 160 has an expanded pattern through the first and second conductive layers 161 and 161A, the first electrode 160 can stably make contact with the side surface of the first conductive type semiconductor layer 110, so that current can be effectively supplied.

The first conductive layer 161 may be separated from the active layer 115 at a predetermined distance D6. An insulating layer 190 may be provided at outer portions of the second part 113 of the first conductive type semiconductor layer 110, the active layer 115, and the second conductive type semiconductor layer 120. The insulating layer 190 can prevent electrical short, and is applicable for another embodiment.

Figure 16:
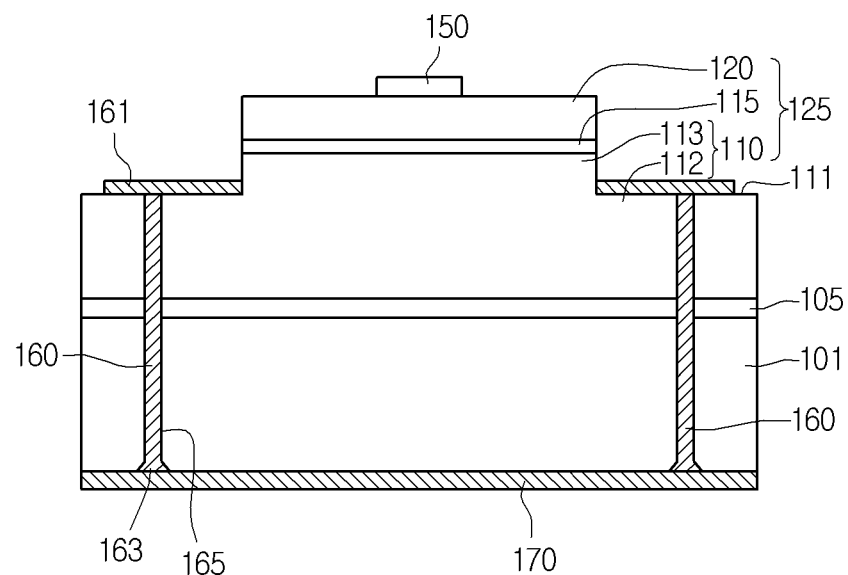
FIGS. 16 and 17 are a side sectional view and a plan view showing a light emitting device according to a fourth embodiment.
Figure 17:
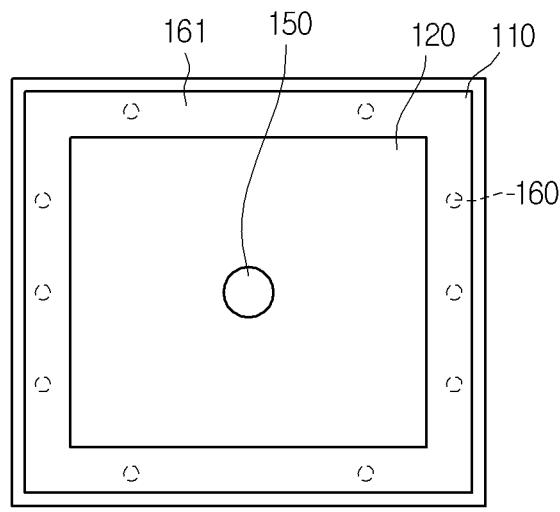

FIG. 16 is a side sectional view showing a light emitting device according to a fourth embodiment, and FIG. 17 is a plan view of FIG. 16. In the following description about the fourth embodiment, structures and components the same as those of the first embodiment will be not further described in order to avoid redundancy.

Referring to FIGS. 16 and 17, in a light emitting device 100C, the first conductive layer 161 is provided on the top surface 111 of the first part 112 of the first conductive type semiconductor layer 110. The first conductive layer 161 may electrically connect the first electrodes 160 to each other as shown in FIG. 17. The first conductive layer 161 may have a loop shape, or may be divided into a plurality of regions.

An electrode layer 170 is formed on a lower surface of the substrate 101. The electrode layer 170 may include one of selected from the group consisting of Ag, Ag alloy, Ni, Al, Al alloy, Rh, Pd, Ir, Ru, Mg, Zn, Pt, Au, and Hf or alloy thereof. The electrode layer 170 may serve as a reflective electrode. The electrode layer 170 may serve as a bonding layer for die-bonding.

The electrode layer 170 may be formed by stacking two materials having different refractive indexes. For example, the electrode layer 170 may be formed by stacking at least two materials selected from the group consisting of ITO, IZO, IZTO, IAZO, IGZO, IGTO, AZO, ATO, GZO, Ag, Ag alloy, Ni, Al, Al alloy, Rh, Pd, Ir, Ru, Mg, Zn, Pt, Au, and Hf.

In addition, according to the embodiment, a heat plate may be provided in addition to the electrode layer 170. The heat plate may include metallic material having superior thermal conductivity. The heat plate may be connected to the electrode layer 170, or may be separated from the electrode layer 170.

Figure 18:
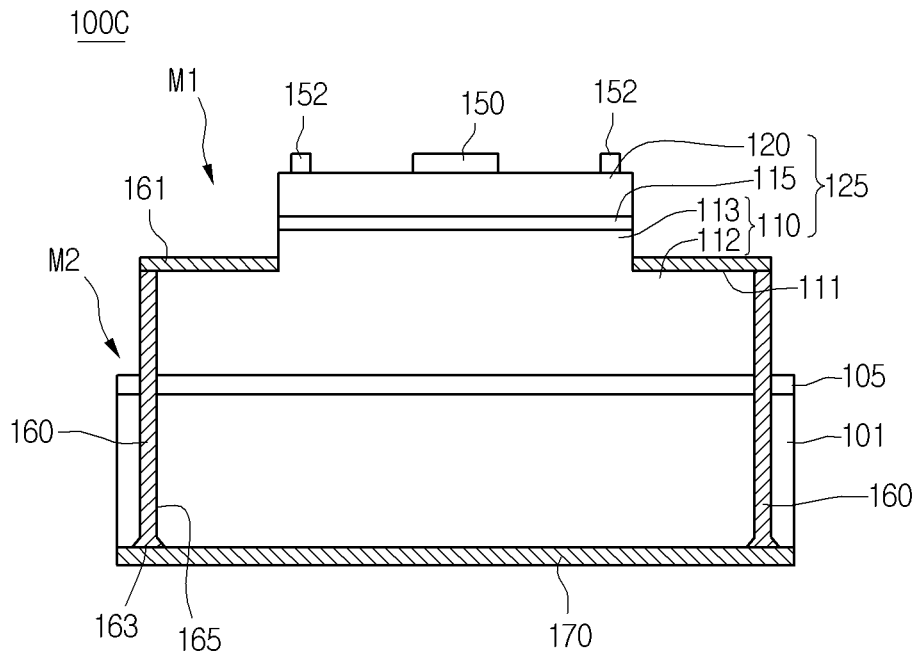
FIG. 18 is a side sectional view showing a light emitting device according to a fifth embodiment.

FIG. 18 is a side sectional view showing a light emitting device according to a fifth embodiment. In the following description about the fifth embodiment, structures and components the same as those of the fourth embodiment will be not further described in order to avoid redundancy.

Referring to FIG. 18, in the light emitting device 100C, a portion of the first conductive type semiconductor layer 110 and the top surface of the first semiconductor layer 105 may be exposed. The portion of the first conductive type semiconductor layer 110 and the top surface of the first semiconductor layer 105 may be formed through at least two etching processes.

In this case, the at least two etching processes include an isolation etching process and a mesa etching process. The second channel region M2 may be exposed through the isolation etching process, and the first channel region M1 may be exposed through the mesa etching process. The first and second channel regions M1 and M2 may be exposed through a dry etching process, but the embodiment is not limited thereto. A portion of the channel regions M1 and M2 that is not participated in light emitting may be used an electrode region.

The first electrode 160 includes the first conductive layer 161 provided on the top surface 111 of the first part 112 of the first conductive type semiconductor layer 110 and making electrical contact. A second conductive layer may not be formed on the top surface of the first semiconductor layer 105.

The first conductive layer 161 may electrically connect the first electrodes 160 to each other as shown in FIG. 17. One first conductive layer 161 or a plurality of first conductive layers 161 may be provided. If a plurality of first conductive layers 161 are be provided, the first conductive layers 161 may be spaced apart from each other.

The first electrode 160 may extend from the side surface of the first part 112 of the first conductive type semiconductor layer 110 to a lower end of the substrate 191, and may be connected to a lower surface of the first conductive layer 161.

The electrode layer 170 is formed at the lower surface of the substrate 101. The electrode layer 170 may include one selected from the group consisting of Ag, Ag alloy, Ni, Al, Al alloy, Rh, Pd, Ir, Ru, Mg, Zn, Pt, Au, and Hf or the alloy thereof, and may serve as a reflective electrode. In addition, the electrode layer 170 may be used as a bonding layer for die-bonding.

The electrode layer 170 may be formed by stacking two materials having different refractive indexes. For example, the electrode layer 170 may be formed by stacking at least two materials selected from the group consisting of ITO, IZO, IZTO, IAZO, IGZO, IGTO, AZO, ATO, GZO, Ag, Ag alloy, Ni, Al, Al alloy, Rh, Pd, Ir, Ru, Mg, Zn, Pt, Au, and Hf.

Figure 19:
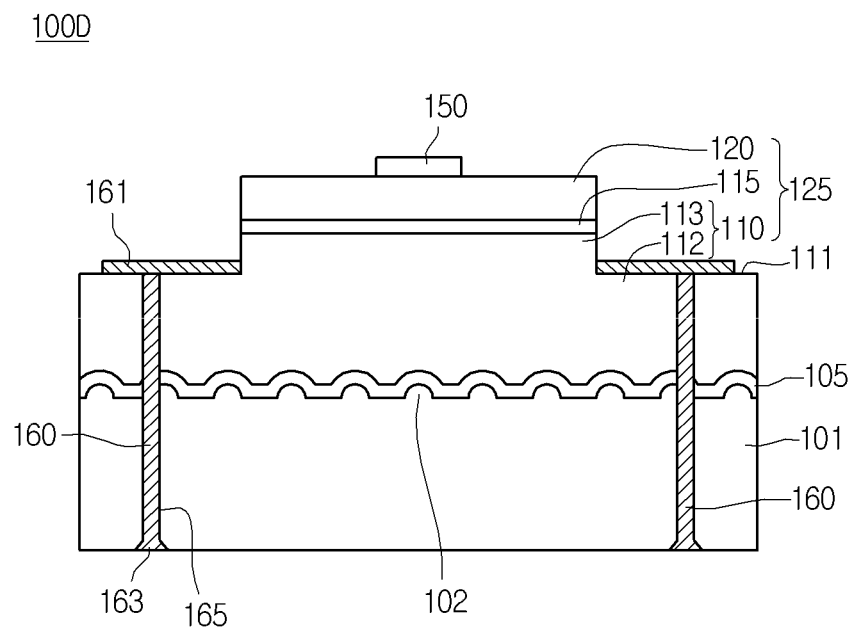
FIG. 19 is a side sectional view showing a light emitting device according to a sixth embodiment.

FIG. 19 is a side sectional view showing a light emitting device according to a sixth embodiment. In the following description about the sixth embodiment, structures and components the same as those of the first embodiment will be not further described in order to avoid redundancy.

Referring to FIG. 19, in a light emitting device 100D, a concavo-convex structure 102 is formed on the substrate 101, and can reflect light emitted from the active layer 115. The concavo-convex structure 102 of the substrate 101 changes the critical angle of light traveling from the active layer 115 to the substrate 101, so that external quantum efficiency can be improved.

The first semiconductor layer 105 may have a concavo-convex structure corresponding to the concavo-convex structure 102 of the substrate 101. The concavo-convex structure 102 may include patterns arranged at the interval of ½λ or ¼λ.

Figure 20:
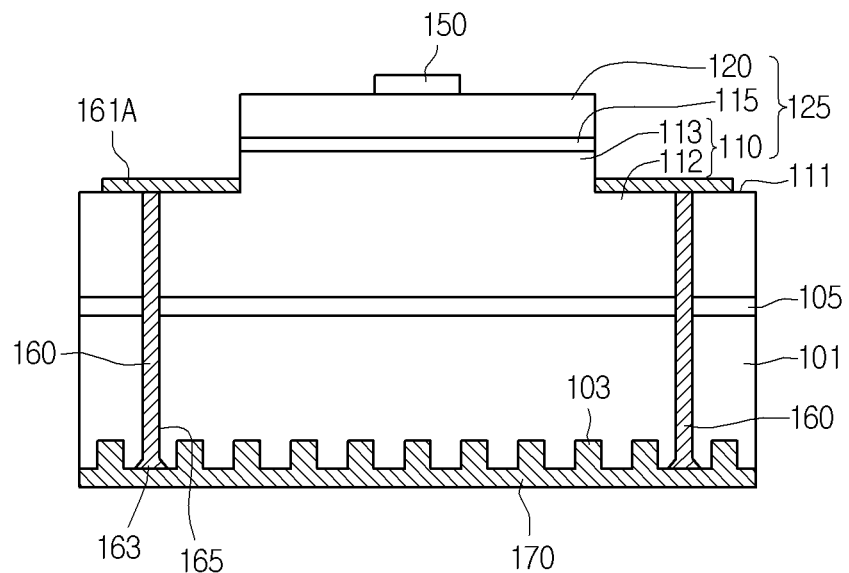
FIG. 20 is a side sectional view showing a light emitting device according to a seventh embodiment.

FIG. 20 is a side sectional view showing a light emitting device according to a seventh embodiment. In the following description about the seventh embodiment, structures and components the same as those of the first embodiment will be not further described in order to avoid redundancy.

Referring to FIG. 20, in a light emitting device 100E, a concavo-convex structure 103 and the electrode layer 170 are formed on the lower surface of the substrate 101. The electrode layer 170 may be formed corresponding to the concavo-convex structure 103 of the substrate 101. The electrode layer 170 may serve as a reflective electrode. The concavo-convex structure 103 may have patterns arranged at the interval of ½λ or ¼λ.

The concavo-convex structure 103 formed on the lower surface of the substrate 101 may change the critical angle of light emitted from the active layer 115 to the substrate 101. The electrode layer 170 may reflect incident light. The concavo-convex structure 103 and the electrode layer 170 of the substrate 101 change the critical angle of light traveling downward the substrate 101 from the active layer 115, so that external quantum efficiency can be improved. According to the embodiment, the concavo-convex structure of FIG. 19 may be formed on the substrate 101, but the embodiment is not limited thereto.

Figure 21:
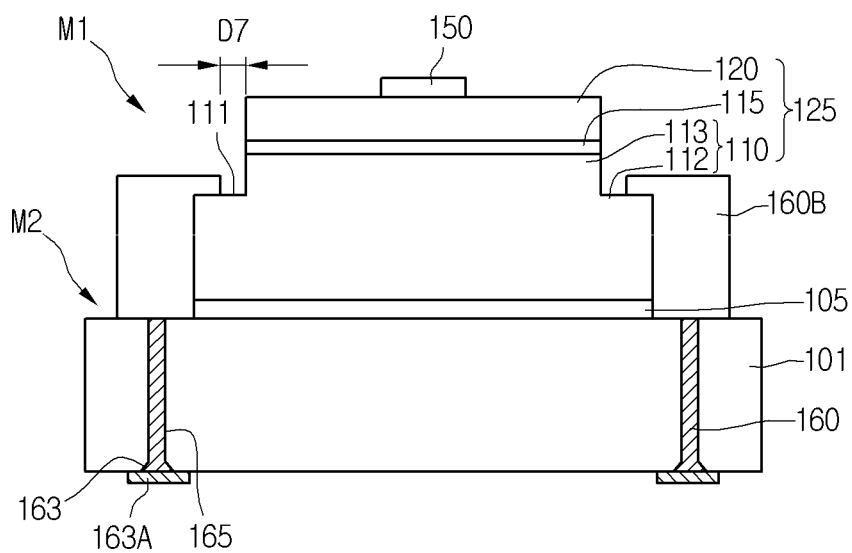
FIG. 21 is a side sectional view showing a light emitting device according to an eighth embodiment.

FIG. 21 is a side sectional view showing a light emitting device according to an eighth embodiment. In the following description about the eighth embodiment, structures and components the same as those of the first embodiment will be not further described in order to avoid redundancy.

Referring to FIG. 21, in a light emitting device 100F, the top surface of the substrate 101 and the top surface 111 of the first part 112 of the first conductive type semiconductor layer 110 are exposed.

The first electrode 160 passes through the substrate 101, and is exposed through the top and lower surfaces of the substrate 101. Third conductive layers 163A are provided under lower ends of the first electrodes 160, and may electrically connect the first electrodes 160 to each other.

A third conductive layer 160B is formed on an upper end of the first electrode 160, and is extended from the top surface of the substrate 101 to the top surface 111 of the first part 112 of the first conductive type semiconductor layer 110. A lower end of the third conductive layer 160B makes contact with the upper end of the first electrode 160, and an inner portion of the third conductive layer 160B makes contact with the side surface of the first part 112 of the first conductive type semiconductor layer 110. Accordingly, the first electrode 160 and the third electrode layer 160B can uniformly supply current throughout the whole region of the first conductive type semiconductor layer 110.

According to the embodiment, the third conductive layer 163A may include a metallic material or may include a conductive sheet and/or an electrode, but the embodiment is not limited thereto.

The third conductive layer 160B is spaced apart from the side surface of the second part 113 of the first conductive type semiconductor layer 110 at a predetermined distance D7, thereby preventing inter-layer short.

The widths of the active layer 115 and the first conductive type semiconductor layer 110 may be narrower than the width of the substrate 101.

Figure 22:
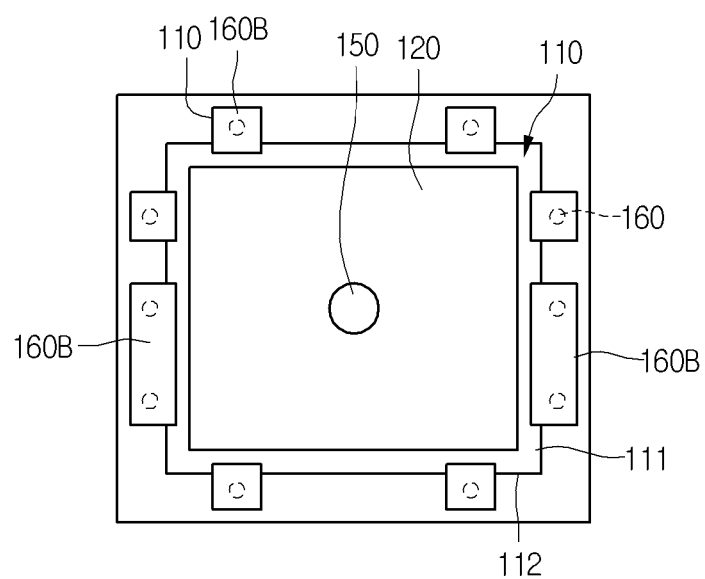
FIG. 22 is a side sectional view showing a light emitting device according to a ninth embodiment.

FIG. 22 is a side sectional view showing a light emitting device according to a nine embodiment. In the following description about the nine embodiment, structures and components the same as those of the first embodiment will be not further described in order to avoid redundancy.

Referring to FIG. 22, a light emitting device includes a plurality of first conductive layers 161, and one or a plurality of first electrodes 160 are provided under the first conductive layers 161. The pad 150 may be provided at the center of the second conductive type semiconductor layer 120, but the embodiment is not limited thereto.

According to the embodiment, the light emitting device may be subject to through a part mesa etching process by the width of the first conductive layer 161. According to the part mesa etching process, a region required to form an electrode is etched, and a hole is formed in the etched region, thereby forming the first electrode 160 and the first conductive layer 161. In this case, a region that is not subject to the mesa etching process may be used as a light emitting region because the active layer is not etched. Accordingly, a light emitting area disclosed in the embodiment can be improved.

Accordingly, the first electrode 160 can be connected to the outer portion of the first conductive type semiconductor layer 110 by the first conductive layer 161. The outer portion of the substrate 101 may be exposed through the isolation etching process.

Figure 23:
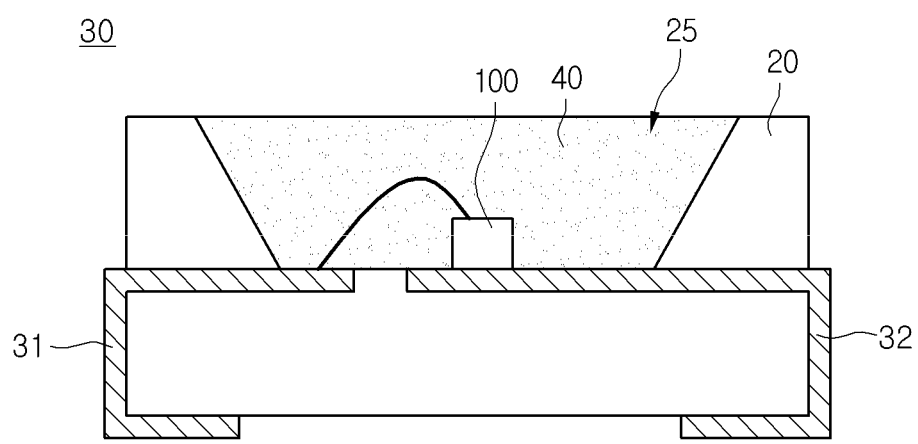
FIG. 23 is a side sectional view showing a light emitting device according to a tenth embodiment.

FIG. 23 is a sectional view showing a light emitting device package according to a tenth embodiment.

Referring to FIG. 23, a light emitting device package 30 includes a body 20, first and second lead electrodes 32 and 33 formed on the body 20, the light emitting device 100 according to the embodiment provided on the body 20 and electrically connected to the first and second lead electrodes 32 and 33 and a molding member 40 that surrounds the light emitting device 100.

The body 20 may be silicon, synthetic resin, or metallic material. A cavity 22 may be formed at an upper portion of the body 20, and the light emitting device 100 is provided in the cavity 25. An inclined surface may be formed around the light emitting device 100. The cavity 25 may be perpendicular to the lower surface of the body 20 or inclined with respect to the lower surface of the body 20, but the embodiment is not limited thereto.

The first and second lead electrodes 32 and 33 are electrically isolated from each other to supply power to the light emitting device 100. In addition, the first and second lead electrodes 32 and 33 reflect the light emitted from the light emitting device 100 to improve the light efficiency and dissipate heat generated from the light emitting device 100 to the outside.

The light emitting device 100 can be installed on the body 20 or the first and second lead electrodes 32 and 33.

The light emitting device 100 is connected to the first lead electrode 31 through a wire, and is die-bonded with the second lead electrode 32.

The molding member 40 surrounds the light emitting device 100 to protect the light emitting device 100. In addition, the molding member 40 includes a phosphor to change the wavelength of light emitted from the light emitting device 100.

The light emitting device according to the embodiment (embodiments) is die-bonded to the second lead electrode 32 through an insulating substrate or a growth substrate, and packaged, so that the light emitting device can be used as a light source of an indicator, a lighting device, and a display device. The embodiment may be selectively applicable to another embodiment.

The light emitting device or the light emitting device package according to the embodiment can be applied to a light unit as a light source. The light unit has a structure in which a plurality of light emitting device packages are arrayed, and includes an illumination lamp, a signal lamp, a headlight of a vehicle, and an electric sign board.

<Illumination System>

The light emitting device or the light emitting device package according to the embodiment can be applied to the light unit. The light unit includes a plurality of light emitting devices or a plurality of light emitting device packages which are arrayed in the light unit. The light unit may include a lighting lamp, a signal lamp, a headlight of a vehicle, and an electric signboard.

Figure 24:
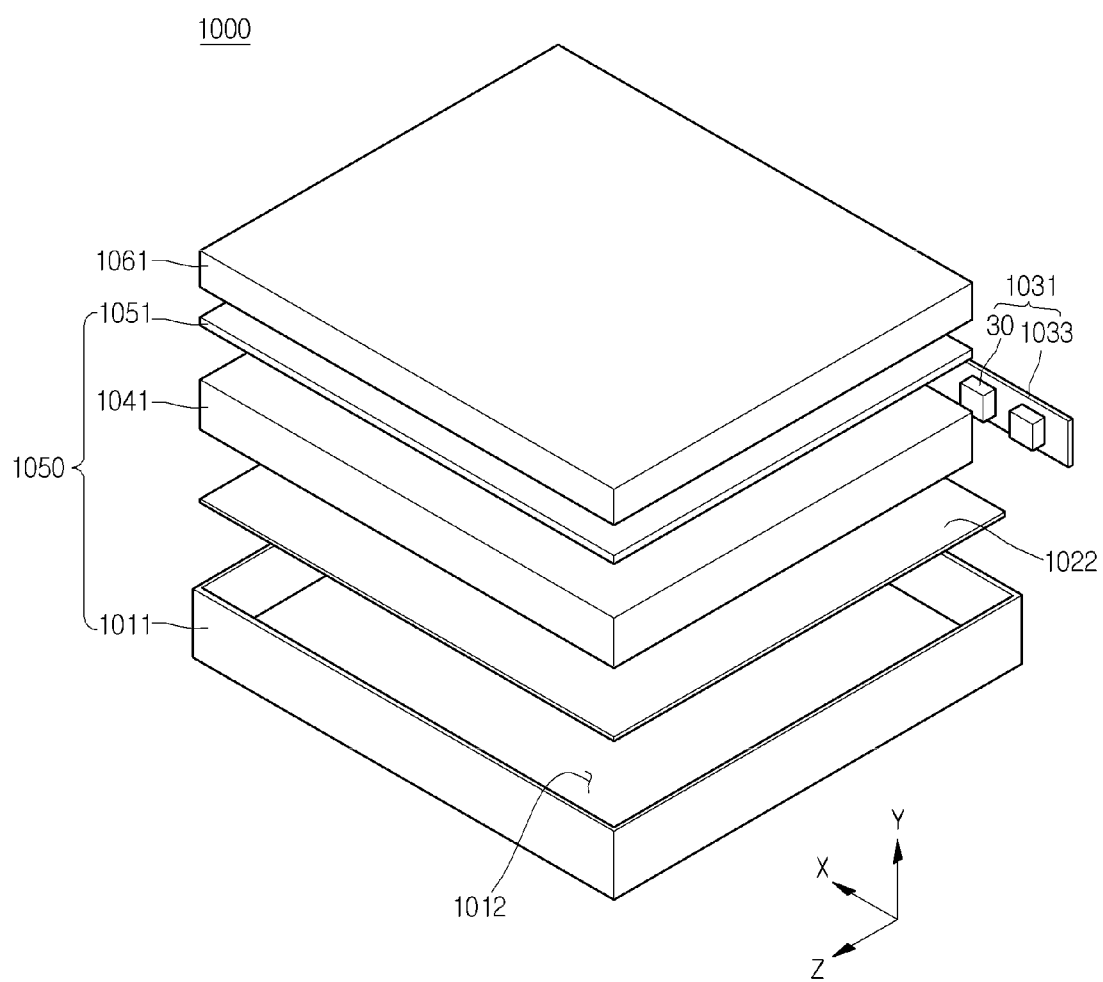
FIG. 24 is a diagram illustrating a display device according to an embodiment.
Figure 25:
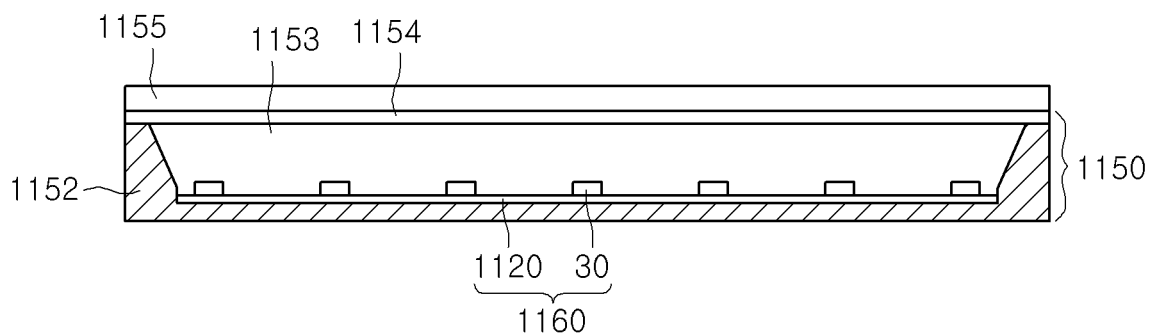
FIG. 25 is a diagram illustrating another display device according to an embodiment.
Figure 26:
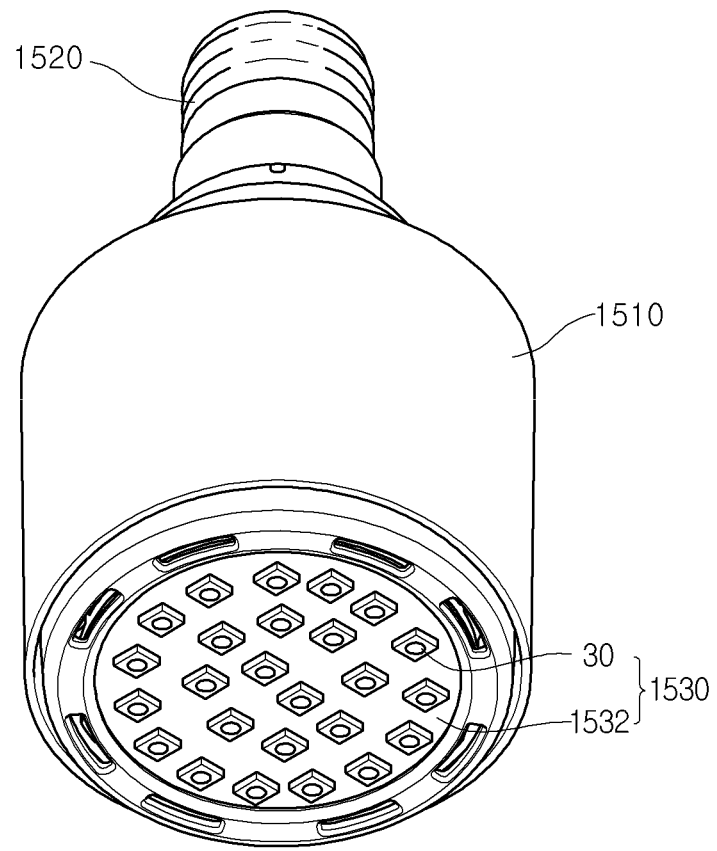
FIG. 26 is a diagram illustrating an illumination device according to an embodiment.

The illumination system may include display devices illustrated in FIGS. 24 and 25, an illumination device illustrated in FIG. 26, illumination lamps, signal lights, car headlights, electronic displays, and the like.

FIG. 24 is an exploded perspective view illustrating a display device according to an embodiment.

Referring to FIG. 24, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transmittive material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins; however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transmittive first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 25 is a diagram illustrating a display device according to an embodiment.

Referring to FIG. 25, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 26 is a perspective view illustrating an illumination device according to an embodiment.

Referring to FIG. 26, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be formed as a pin shape to be inserted into the external power source or may be connected to the external power source by a wire.

A method of manufacturing a light emitting device according to the embodiment includes the steps of forming a plurality of compound semiconductor layers including a first conductive type semiconductor layer, an active layer, and a second conductive type semiconductor layer on a substrate; exposing a part of the first conductive type semiconductor layer through a first etching process; forming at least one hole passing through from the exposed first conductive type semiconductor layer to a lower surface of the substrate; and forming at least one first electrode in at least one hole, so that electrical connection is formed from the lower surface of the substrate to the part of the first conductive type semiconductor layer through the electrode.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate;
   a light emitting structure layer including a first conductive type semiconductor layer formed on the substrate and having first and second upper surfaces, in which the second upper surface is closer to the substrate than the first upper surface, an active layer on the first conductive type semiconductor layer, and a second conductive type semiconductor layer on the active layer;
   a second electrode on the second conductive type semiconductor layer;
   a plurality of first electrodes extending at least from the second upper surface of the first conductive type semiconductor layer to a lower surface of the substrate by passing through the substrate;
   an inclined side surface between the first and the second upper surfaces of the first conductive type semiconductor layer; and
   a first conductive layer disposed on the second upper surface of the first conductive type semiconductor layer and the inclined side surface and connected to the plurality of first electrodes,
   wherein the upper portions of the plurality of first electrodes are spaced apart from each other.

2. The light emitting device of claim 1, further comprising at least one first semiconductor layer between the first conductive type semiconductor layer and the substrate, wherein the second upper surface of the first conductive type semiconductor layer is formed of a stepped surface from at least one side surface of the active layer.

3. The light emitting device of claim 2, wherein a portion of the first semiconductor layer is extended outward from a side surface of the first conductive type semiconductor layer, and a third conductive layer is connected to a portion of the first electrode by passing through the first semiconductor layer.

4. The light emitting device of claim 1, wherein a lower width of the first electrode is equal to or wider than an upper width of the first electrode.

5. The light emitting device of claim 1,
wherein the first conductive layer connects upper portions of the plurality of first electrodes to each other,
wherein the first conductive layer is contacted with the second upper surface of the first conductive type semiconductor layer.

6. The light emitting device of claim 1, wherein the first electrode includes a structure perpendicular or inclined with respect to a lower surface of the first conductive type semiconductor layer.

7. The light emitting device of claim 1, wherein the second electrode is closer to an edge region of an upper surface of the second conductive type semiconductor layer than to a center region of the upper surface of the second conductive type semiconductor layer.

8. The light emitting device of claim 1, further comprising a second conductive layer for connecting lower portions of at least two first electrodes to each other.

9. The light emitting device of claim 1, wherein an at least one of upper and lower surface of the substrate includes a concavo-convex structure.

10. The light emitting device of claim 1, further comprising a current spreading layer between at least a part of the second electrode and the second conductive type semiconductor layer.

11. A light emitting device comprising:
a substrate including a transmittive material;
a light emitting structure layer including a first conductive type semiconductor layer disposed on the substrate and having an outer portion stepped from at least one side of the substrate, an active layer on an inner portion of the first conductive type semiconductor layer, and a second conductive type semiconductor layer on the active layer;
a second electrode on the second conductive type semiconductor layer; and
a plurality of first electrodes extending from a lower surface of the substrate to a side surface of the outer portion of the first conductive type semiconductor layer by passing through the substrate.

12. The light emitting device of claim 11, wherein the first electrodes extend to an upper surface of the outer portion of the first conductive type semiconductor layer while being spaced apart from each other, and the upper surface of the outer portion of the first conductive type semiconductor layer includes a Ga-face.

13. The light emitting device of claim 11, wherein a width of the active layer and an upper surface of the first conductive type semiconductor layer is narrower than a width of an upper surface of the substrate.

14. The light emitting device of claim 11, wherein the first electrodes include an electrode extending from the lower surface of the substrate to an upper surface of the substrate and a conductive layer extending to an upper surface of the electrode and the side surface of the outer portion of the first conductive type semiconductor layer.

15. The light emitting device of claim 11, wherein an at least one of upper and lower surfaces of the substrate includes a concavo-convex structure.

16. The light emitting device of claim 15, further comprising a reflective layer connecting the first electrodes to the lower surface of the substrate.

17. The light emitting device of claim 11, wherein the first conductive type semiconductor layer includes an N type semiconductor layer and the second conductive type semiconductor layer includes a P type semiconductor layer.

18. The light emitting device of claim 11, wherein the second electrode includes at least one pad and has a continuous or discontinuous loop shape branching from the pad.

19. A light emitting device comprising:
a substrate;
a light emitting structure layer including a first conductive type semiconductor layer formed on the substrate and having first and second upper surfaces, in which the second upper surface is closer to the substrate than the first upper surface, an active layer on the first conductive type semiconductor layer, and a second conductive type semiconductor layer on the active layer;
a second electrode on the second conductive type semiconductor layer;
a plurality of first electrodes extending at least from the second upper surface of the first conductive type semiconductor layer to a lower surface of the substrate by passing through the substrate; and
a first conductive layer connecting upper portions of the plurality of first electrodes to each other,
wherein the first conductive layer is contacted with the second upper surface of the first conductive type semiconductor layer,
wherein the upper portions of the plurality of first electrodes are spaced apart from each other, and
wherein the second upper surface of the first conductive type semiconductor layer is formed of a stepped surface from at least one side surface of the active layer.

20. The light emitting device of claim 19, further comprising a second conductive layer for connecting lower portions of the plurality of first electrodes to each other,
wherein the second conductive layer is contacted with the lower surface of the substrate.

* * * * *